US009709649B2

United States Patent
Xiong et al.

(10) Patent No.: US 9,709,649 B2
(45) Date of Patent: Jul. 18, 2017

(54) SYSTEM AND METHOD FOR ASSESSING ADENOSINE TRIPHOSPHATE HYDROLYSIS RATE USING DOUBLE SATURATION TRANSFER MAGNETIC RESONANCE IMAGING AND SPECTROSCOPY

(71) Applicants: Qiang Xiong, Cambridge, MA (US); Jianyi Zhang, Minneapolis, MN (US)

(72) Inventors: Qiang Xiong, Cambridge, MA (US); Jianyi Zhang, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 637 days.

(21) Appl. No.: 14/175,518

(22) Filed: Feb. 7, 2014

(65) Prior Publication Data
US 2014/0225609 A1   Aug. 14, 2014

Related U.S. Application Data

(60) Provisional application No. 61/762,619, filed on Feb. 8, 2013.

(51) Int. Cl.
*G01R 33/485* (2006.01)

(52) U.S. Cl.
CPC .................... *G01R 33/485* (2013.01)

(58) Field of Classification Search
CPC ............ G01R 33/5608; G01R 33/4828; G01R 33/4835; G01R 33/543; A61B 5/055
USPC ........................................................ 324/309
See application file for complete search history.

(56) References Cited

U.S. PATENT DOCUMENTS

| 5,201,311 A * | 4/1993 | Bottomley ........... G01R 33/485 324/307 |
| 6,600,316 B2 | 7/2003 | Chen et al. |
| 2006/0014761 A1* | 1/2006 | Morgan ............... C07D 211/56 514/256 |
| 2010/0010336 A1* | 1/2010 | Pettegrew ............ A61K 31/22 600/410 |
| 2011/0053245 A1* | 3/2011 | Weiner ............... A01K 67/0275 435/192 |
| 2011/0144474 A1 | 6/2011 | Ouwerkerk |
| 2011/0210733 A1* | 9/2011 | Wheaton ............ G01R 33/5607 324/309 |
| 2012/0019245 A1* | 1/2012 | Reddy ................ G01R 33/5601 324/309 |

OTHER PUBLICATIONS

Bogner, et al., In Vivo 31P Spectroscopy by Fully Adiabatic Extended Image Selected in Vivo Spectroscopy: A Between 3T and 7T, Magnetic Resonance in Medicine, 2011, 66(4):923-930.

Dabirzadeh, RF Coil Design for Multi-Frequency Magnetic Resonance Imaging and Spectroscopy, Thesis Submitted to the Office of Graduate Studies of Texas A&M University, Dec. 2008.

(Continued)

*Primary Examiner* — Walter L Lindsay, Jr.
*Assistant Examiner* — Frederick Wenderoth
(74) *Attorney, Agent, or Firm* — Quarles & Brady LLP (57) ABSTRACT

A system and method for acquiring and using inversion-recovery data and spectral data. In particular, the inversion-recovery data and spectral data can be used to determine adenosine triphosphate (ATP) hydrolysis rate of a subject without a quantification of inorganic phosphate.

19 Claims, 4 Drawing Sheets

(56) References Cited

OTHER PUBLICATIONS

De Graaf, et al., B1-Insensitive, Single-Shot Localization and Water Suppression, Journal of Magnetic Resonance, Series B, 1996, 113(1):35-45.

Flachskampf, et al., Cardiac Imaging After Myocardial Infarction, European Heart Journal, 2011, 32:272-283.

Jameel, et al., Long-Term Preservation of Myocardial Energetic in Chronic Hibernating Myocardium, Am. J. Physiol. Heart Circ. Physiol., 2011, 300:H836-H844.

Kingsley, et al., Correcting for Incomplete Saturation and Off-Resonance Effects in Multiple-Site Saturation-Transfer Kinetic Measurements, Journal of Magnetic Resonance, 2000, 146:100-109.

Lee, et al., Uniform Saturation of a Strongly Coupled Spin System by Two-Frequency Irradiation, The Journal of Chemical Physics, 2011, 134:234504-1 thru 234504-6.

Lei, et al., Measurement of Unidirectional Pi to ATP Flux in Human Visual Cortex at 7T by Using in Vivo 31P Magnetic Resonance Spectroscopy, PNAS, 2003, 100(24):14409-14414.

Madelin, Double Inversion Recovery MRI with Fat Suppression at 3T and 7T, Proc. Intl. Soc. Mag. Reson. Med., 2008, 16:1328.

Morrell, An Analytic Framework for the Evaluation of Coil Configurations for Parallel Transmission MRI with Subsampled Cartesian Excitation k-Space, IEEE Transactions on Medical Imaging, 2010, 29(2):523-530.

Scheidegger, et al., Amide Proton Transfer Imaging with Continuous Wave Dual Frequency Saturation Can Detect the Amide Proton Peak in the Z-Spectrum Acquired at 3T, Proc. Intl. Soc. Mag. Reson. Med., 2011, 19:2769.

Smith, et al., Simultaneous Water and Lipid Suppression for in Vivo Brain Spectroscopy in Humans, Magnetic Resonance in Medicine, 2005, 54(3):691-696.

Spencer, et al., ATP Synthesis and Degradation Rates in the Perfused Rat Heart, 31P-Nuclear Magnetic Resonance Double Saturation Transfer Measurements, Biophys. J., 1988, 54:921-929.

Spencer, 31P Nuclear Magnetic Resonance Spectroscopy Studies of Cardiac Energetics and Function in the Perfused Rat Heart, Thesis Submitted to the Department of Medical Engineering and Medical Physics at the Massachusetts Institute of Technology, Apr. 1987, 304 pages.

Xing, et al., Spectrally Selective 31P MR Imaging at 3 Tesla, SSK19-06, Abstract Archives of the RSNA, 2009, Presented as part of SSK19: Physics (MR Spectroscopy), 2 pages.

Xiong, et al. Novel Strategy for Measuring Creatine Kinase Reaction Rate in the in Vivo Heart, Am. J. Physiol. Heart Circ. Physiol., 2009, 297:H1010-H1019.

Xiong, et al., Bioenergetic and Functional Consequences of Cellular Therapy, Activation of Endogenous Cardiovascular Progenitor Cells, Circulation Research, 2012, 111:455-468.

Xiong, et al., Abstract 12300: Heterogeneity of ATP Turnover Rates in the LV of Swine Hearts with Post-Infarction Remodeling, Circulation, 2012, 126:A12300.

Xiong, et al., Functional Consequences of Human Induced Pluripotent Stem Cell Therapy, Myocardial ATP Turnover Rate in the in Vivo Swine Heart With Postinfarction Remodeling, Circulation, 2013, 127:997-1008.

\* cited by examiner

SYSTEM AND METHOD FOR ASSESSING ADENOSINE TRIPHOSPHATE HYDROLYSIS RATE USING DOUBLE SATURATION TRANSFER MAGNETIC RESONANCE IMAGING AND SPECTROSCOPY

CROSS-REFERENCE TO RELATED APPLICATIONS

This application is based on, claims priority to, and incorporates herein by reference U.S. Provisional Application Ser. No. 61/762,619, filed Feb. 8, 2013, and entitled, "METHOD FOR IN VIVO MEASUREMENT OF ADENOSINE TRIPHOSPHATE HYDROLYSIS RATE USING DOUBLE SATURATION TRANSFER MAGNETIC RESONANCE IMAGING AND SPECTROSCOPY."

STATEMENT REGARDING FEDERALLY SPONSORED RESEARCH

This invention was made with government support under HL67828, HL114120, HL95077, HL100407, and RR08079 awarded by the National Institutes of Health. The government has certain rights in the invention.

BACKGROUND

Adenosine triphosphate (ATP) utilization rate is directly related to the functionality of organ systems, such as contractility of the heart or neuron activity level in the brain. The study of ATP hydrolysis rate will help basic science researchers to investigate the energetic foundation of the function and dysfunction of certain organs. The ATP hydrolysis rate also has great potential in clinical applications. For instance, the ATP hydrolysis rate is tightly correlated to the severity of certain heart diseases (e.g. myocardial infarction), as shown by Q. Xiong, et al., in "Heterogeneity of ATP Turnover Rates in the LV of Swine Hearts with Post-Infarction Remodeling," *Circulation*, 2012; 126:A12300. Thus, the ATP hydrolysis rate may serve as a quantitative metric to categorize heart disease patients for different treatment options, help characterize the severity of heart disease, predict the patient's prognosis, and indicate therapeutic efficacies of certain treatments.

Conventional magnetic resonance spectroscopy (MRS)-magnetization saturation transfer (MST) experiments have been used to measure ATP hydrolysis rate. The in vivo metabolism of ATP may be modeled as a chemical exchange network among phosphocreatine (PCr), ATP, and inorganic phosphate (Pi) (Equation 1):

$$PCr \underset{k_{ATP \to PCr}}{\overset{k_{PCr \to ATP}}{\rightleftharpoons}} ATP \underset{k_{Pi \to ATP}}{\overset{k_{ATP \to Pi}}{\rightleftharpoons}} Pi; \quad [1]$$

where the PCr ↔ ATP exchange is catalyzed by creatine kinase (CK), the ATP ↔ Pi exchange incorporates all other cellular activities that produce and consume ATP (Ugurbil, 2011), and k is the pseudo-first-order rate constant for the unidirectional reactions.

Conventionally, the evolution of visible MR magnetizations during chemical exchange are modeled with the modified Block-McConnell equations (Equations 2-4) (Bloch, 1946; McConnell, 1958):

$$\frac{dM_{PCr}(t)}{dt} = \frac{M_{0,PCr} - M_{PCr}(t)}{T_{1,PCr}^{int}} - k_{PCr \to ATP}M_{PCr}(t) + k_{ATP \to PCr}M_{ATP\gamma}(t); \quad [2]$$

$$\frac{dM_{Pi}(t)}{dt} = \frac{M_{0,Pi} - M_{Pi}(t)}{T_{1,Pi}^{int}} - k_{Pi \to ATP}M_{Pi}(t) + k_{ATP \to Pi}M_{ATP\gamma}(t); \quad [3]$$

$$\frac{dM_{ATP\gamma}(t)}{dt} = \frac{M_{0,ATP\gamma} - M_{ATP\gamma}(t)}{T_{1,ATP\gamma}^{int}} + k_{PCr \to ATP}M_{PCr}(t) + \quad [4]$$
$$k_{Pi \to ATP}M_{Pi}(t) - (k_{ATP \to PCr} + k_{ATP \to Pi})M_{ATP\gamma}(t);$$

By selectively saturating the terminal phosphate of ATP (ATPγ) magnetization during the MST experiment, Equations 2-4 change to Equations 5-7, respectively:

$$\frac{dM_{PCr}(t)}{dt} = \frac{M_{0,PCr} - M_{PCr}(t)}{T_{1,PCr}^{int}} - k_{PCr \to ATP}M_{PCr}(t); \quad [5]$$

$$\frac{dM_{Pi}(t)}{dt} = \frac{M_{0,Pi} - M_{Pi}(t)}{T_{1,Pi}^{int}} - k_{Pi \to ATP}M_{Pi}(t); \quad [6]$$

$$M_{ATP\gamma}(t) = 0. \quad [7]$$

Equations 5 and 6 are mathematically equivalent, describing the unidirectional kinetics of ATP production from PCr and Pi, respectively. Solving Equations 5 and 6 yields Equation 8:

$$k_{PCr(Pi) \to ATP} = \left(\frac{M_{0,PCr(Pi)} - M_{ss,PCr(Pi)}}{M_{ss,PCr(Pi)}}\right) / T_{1,PCr(Pi)}^{int}; \quad [8]$$

where $M_{ss}$ and $M_0$ represent the fully relaxed magnetizations with and without saturation of ATPγ, and $T_1^{int}$ is the intrinsic longitudinal relaxation time constant. Thus, the calculation of the ATP production rate constants via Equation 8 requires two fully relaxed spectra: one control spectrum without saturation to obtain $M_{0,PCr(Pi)}$ and one saturated spectrum with the saturation pulse set at the ATPγ frequency to obtain $M_{ss,PCr(Pi)}$. Intrinsic $T_1$ ($T_1^{int}$) is usually a constant among patients and $T_1^{int}$ is unaffected by physiological or pathological conditions; however, if $T_1^{int}$ is not known, it may be calculated from another mathematically equivalent Equation 9:

$$k_{PCr(Pi) \to ATP} = \left(\frac{M_{0,PCr(Pi)} - M_{ss,PCr(Pi)}}{M_{0,PCr(Pi)}}\right) / T_{1,PCr(Pi)}^{app}; \quad [9]$$

where $T_1^{app}$ is measured directly via progressive saturation or inversion recovery acquisitions and $T_1^{app}$ is then used to calculate $T_1^{int}$ according to the following Equation 10:

$$(T_1^{app})^{-1} = (T_1^{int})^{-1} + k \quad [10].$$

As shown in Equation 9, the conventional MST approach for measuring the in vivo ATP ↔ Pi rate constant relies on the quantification of Pi magnetization levels ($M_{Pi}$). It remains difficult to quantify in vivo Pi magnetization levels ($M_{Pi}$), especially for certain organ systems such as in vivo heart, because myocardial Pi levels are intrinsically low and the peaks of Pi and 2,3-diphosphoglycerate (2,3-DPG), which is generated from erythrocytes in the blood, at least partially overlap. Furthermore, there is a lack of consensus about whether intracellular cardiac Pi is completely visible in an MR spectrum (Jeffrey, Storey, 1989; Humphrey and Garlick, 1991).

Thus, there remains a need for a method of measuring the unidirectional ATP→Pi rate constant using magnetic resonance without requiring the direct, quantification of inorganic phosphate (Pi).

DESCRIPTION OF DRAWINGS

The present disclosure overcomes the aforementioned drawbacks by providing a system and method for determining ATP turnover rates in vivo (e.g., unidirectional ATP→Pi rate constants) without requiring direct quantification of Pi magnetization levels ($M_{Pi}$).

In accordance with one aspect of the disclosure, a method for calculating adenosine triphosphate (ATP) hydrolysis rate is disclosed. The method includes acquiring data including intrinsic longitudinal relaxation times of phosphocreatine (PCr) acquired using an inversion recovery data acquisition with saturation of a gamma phosphate in adenosine triphosphate (ATPγ) and acquiring data including an intrinsic longitudinal relaxation time of ATPγ acquired using an inversion recovery data acquisition with both PCr and Pi saturation. The method further includes measuring equilibrium magnetization of PCr, ATPγ, and Pi using a relaxed control phosphorous-31 (P-31) spectrum acquired without saturation, measuring steady-state magnetization of PCr and Pi using a P-31 spectrum acquired with ATPγ saturation, and measuring steady-state magnetization of ATPγ using a P-31 spectrum acquired with both PCr and Pi saturation. The method also includes calculating an ATP hydrolysis rate using the intrinsic longitudinal relaxation times of PCr and ATPγ, the equilibrium magnetization of PCr and ATPγ, and the steady-state magnetization of PCr and ATPγ and generating a report indicating at least the ATP hydrolysis rate.

In accordance with another aspect of the disclosure, a magnetic resonance imaging (MRI) system is disclosed. The MRI system includes a magnet system configured to generate a polarizing magnetic field about at least a region of interest (ROI) in a subject arranged in the MRI system, a plurality of gradient coils configured to apply a gradient field to the polarizing magnetic field, and a radio frequency (RF) system configured to apply an excitation field to the subject and acquire MR image data from a ROI. The MRI system also includes a computer system programmed to control the plurality of gradient coils and the RF system according to a pulse sequence to acquire inversion-recovery data from the subject and control the plurality of gradient coils and the RF system according to a pulse sequence to acquire spectral data from the subject. The processor is further configured to use the inversion-recovery data and the spectral data to determine adenosine triphosphate (ATP) hydrolysis rate of the subject without a quantification of inorganic phosphate.

In accordance with yet another aspect of the disclosure, a non-transitory, computer readable storage medium is disclosed that includes a computer program that, when executed by a computer, causes the computer to carry out a process. In particular, the process includes using inversion-recovery data and spectral data to determine adenosine triphosphate (ATP) hydrolysis rate of a subject without a quantification of inorganic phosphate.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Systems and methods for measuring ATP turnover rates in vivo (e.g., unidirectional ATP→Pi rate constants) without requiring direct quantification of Pi magnetization levels ($M_{Pi}$) are provided. Because quantification of inorganic phosphate is not required for the measurement of ATP hydrolysis rate using these systems and methods, measurements of ATP hydrolysis rate can be made in organ systems where inorganic phosphate level is difficult to quantify, for example, in the in vivo heart.

Although the heart is mentioned as an example of an organ system in which ATP hydrolysis rate can be measured using the provided system and method, the systems and methods of the present disclosure are also applicable to measure ATP hydrolysis rate in other organ systems, such as brain and skeletal muscle, among others. Of the numerous advantages of the systems and method of the present disclosure, these systems and methods also offer improved signal-to-noise ratios over traditional methods because the provided systems and methods can quantify metabolites that are abundantly visible in $^{31}P$ MRS: PCr and ATP.

Mathematically, the theory of measurement is explained as follows. The unidirectional reaction flux in chemical exchange network from Equation 1 can be expressed as:

$$\text{Flux}_{PCr \to ATP} = k_{PCr \to ATP}[\text{PCr}];$$
$$\text{Flux}_{ATP \to PCr} = k_{ATP \to PCr}[\text{ATP}] \quad [11];$$

$$\text{Flux}_{Pi \to ATP} = k_{Pi \to ATP}[\text{Pi}]; \text{Flux}_{ATP \to Pi} = k_{ATP \to Pi}[\text{ATP}] \quad [12]$$

Under homeostatic conditions, none of the metabolites (PCr, Pi, or ATP) accumulate or become depleted, indicating that the reversible reactions operate in equilibrium. Thus, the two unidirectional fluxes for Equations 11 and 12 are equal as shown in:

$$\text{Flux}_{PCr \to ATP} = \text{Flux}_{ATP \to PCr} \quad [13];$$

and the reverse rate constant for the ATP→PCr reaction could be expressed as follows:

$$k_{ATP \to PCr} = \frac{[PCr]}{[ATP]} k_{PCr \to ATP} = \frac{M_{0,PCr}}{M_{0,ATP\gamma}} k_{PCr \to ATP}; \quad [14]$$

where $M_0$ represents the fully relaxed magnetization observed in an MR spectrum. By selectively saturating both the PCr and Pi magnetizations and observing the change in ATPγ magnetization, a new unidirectional rate constant ($k_{ATP,tot}$), representing the summation of both the ATP→Pi and ATP→PCr reactions, may be shown as follows in:

$$k_{ATP,tot} = k_{ATP \to PCr} + k_{ATP \to Pi} \quad [15].$$

The measurement of $k_{ATP,tot}$ may be performed via a method similar to the conventional MST approach. If both PCr and Pi magnetizations are saturated, the evolution of the ATPγ magnetization follows:

$$\frac{dM_{ATP\gamma}(t)}{dt} = \frac{M_{0,ATP\gamma} - M_{ATP\gamma}(t)}{T_{1,ATP\gamma}^{int}} - k_{ATP,tot} M_{ATP\gamma}(t). \quad [16]$$

Solving Equation 16 yields:

$$k_{ATP,tot} = \left(\frac{M_{0,ATP\gamma} - M_{ss,ATP\gamma}}{M_{ss,ATP\gamma}}\right) / T_{1,ATP\gamma}^{int}; \quad [17]$$

where $M_{ss,ATP\gamma}$ and $M_{0,ATP\gamma}$ represent the fully relaxed magnetization of ATPγ with and without, respectively, saturation of both PCr and Pi.

Combining Equations 8, 14, 15 and 17 generates the following:

$$k_{ATP \to Pi} = \left(\frac{M_{0,ATP\gamma} - M_{ss,ATP\gamma}}{M_{ss,ATP\gamma}}\right) / T_{1,ATP\gamma}^{int} - \frac{M_{0,PCr}}{M_{0,ATP\gamma}} \left(\frac{M_{0,PCr} - M_{ss,PCr}}{M_{ss,PCr}}\right) / T_{1,PCr}^{int}. \quad [18]$$

On the basis of Equation 18, the rate constant of ATP→Pi reaction ($k_{ATP \to Pi}$) may be measured by subtracting the rate constant of the reverse CK reaction ($k_{ATP \to PCr}$) from the total rate constant of the combining ATP→Pi and ATP→PCr reactions ($k_{ATP,tot}$). The total rate constant ($k_{ATP,tot}$) may be measured via a PCr-Pi double saturation experiment. Thus, once the chemical shift information of Pi is known, using the present invention, calculations of both $k_{PCr \to ATP}$ and $k_{ATP \to Pi}$ from MST acquisitions are enabled. These calculations can include the measurement of three spectra: 1) a control spectrum without saturation to measure $M_{0,PCr}$ and $M_{0,ATP\gamma}$, 2) an ATPγ-saturated spectrum to measure $M_{ss,PCr}$; and 3) a spectrum with both PCr and Pi saturated to measure $M_{ss,ATP\gamma}$. Thus, by measuring these three spectra, ATP hydrolysis rate can be calculated without directly quantifying Pi levels.

Further, this saturation scheme also readily provides a T1nom correction, which allows saturation experiments to be performed with short repetition time and arbitrary flip angle. Thus, the total data acquisition time may be accelerated by an order of magnitude. Such very-fast data acquisition times can be extremely advantageous for clinical applications.

The equation for the measurement of ATP hydrolysis rate in partial relaxation conditions can be represented by:

$$k_{r,ATPase} = \left(\frac{M_{c,ATP\gamma} - M_{s,ATP\gamma}}{M_{s,ATP\gamma}}\right) / T_{1,ATP\gamma}^{nom} - \frac{M_{0,PCr}}{M_{0,ATP\gamma}} \left(\frac{M_{c,PCr} - M_{s,PCr}}{M_{s,PCr}}\right) / T_{1,PCr}^{nom}; \quad [19]$$

where Mc and Ms refer to magnetization measured from control (no saturation) and saturated spectra, respectively, and T1nom is the correction factor for partial relaxation conditions.

Figure 1:
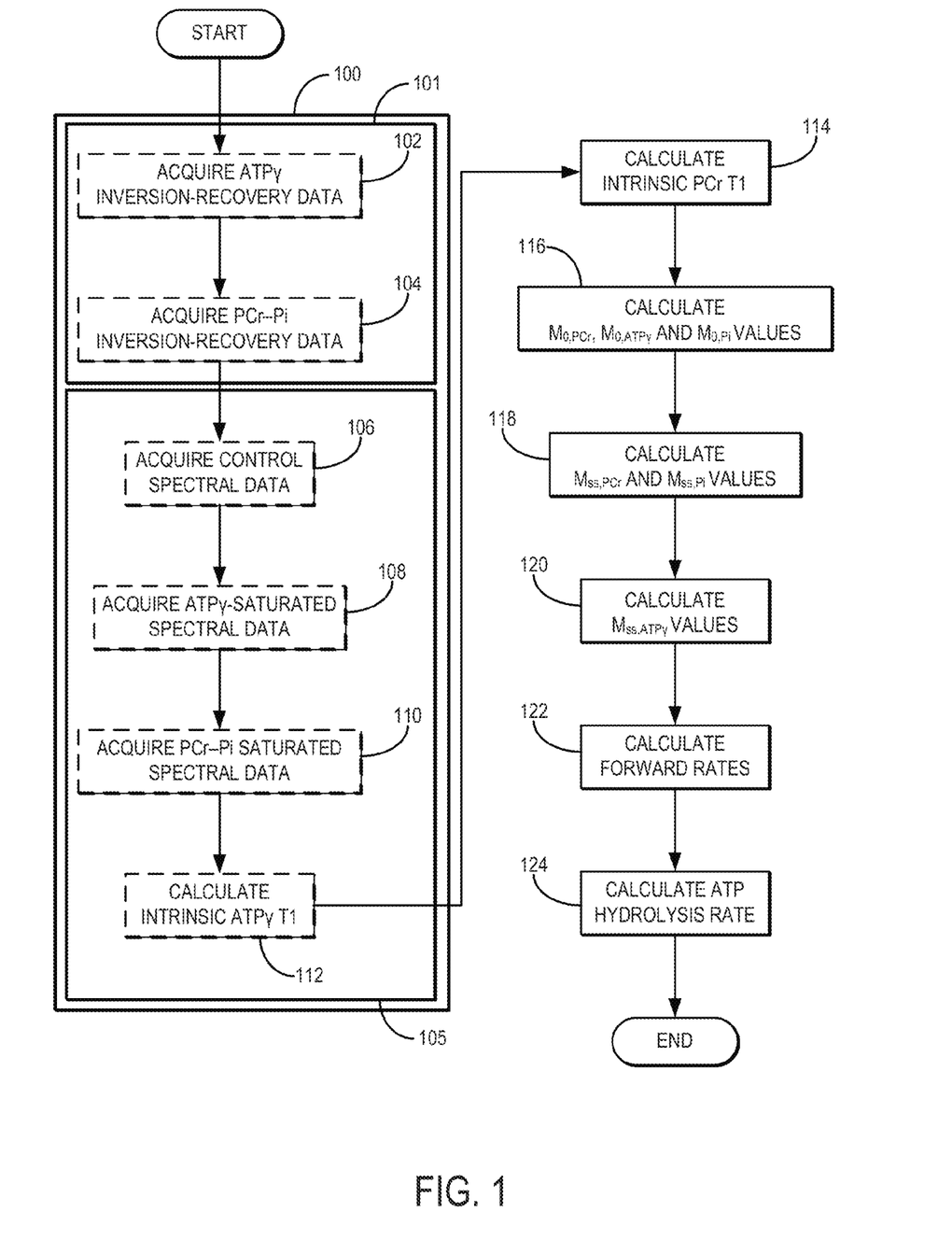
FIG. 1 is a flowchart setting forth the steps of one example of a method in accordance with the present disclosure for calculating ATP hydrolysis rate from P-31 magnetic resonance spectra without requiring a direct quantification of inorganic phosphate magnetization levels.

Referring now to FIG. 1, a flowchart setting forth the steps of an example of a process for calculating ATP turnover rate in vivo using an indirect $^{31}$P MRS-MST method is illustrated. The process begins by acquiring multiple data sets 100 to be used to calculate the ATP hydrolysis rate. Some of the data is inversion-recovery data 101. One of the multiple data sets 100 that may be acquired includes ATPγ inversion-recovery data, as indicated at step 102, which may be acquired using an inversion-recovery pulse sequence in which magnetization for both PCr and Pi is saturated. Another one of the multiple data sets 100 that may be acquired includes PCr inversion-recovery data, as indicated at step 104, which may be acquired using an inversion recovery pulse sequence in which ATPγ magnetization is saturated. Step 104 may also be achieved using a progressive saturation method. Steps 102 and 104 may be utilized to calculate the T1 values for PCr and ATPγ. Since these T1 values are constants for a defined magnetic field, steps 102 and 104 may be omitted for interventional studies. For example, steps 102 and 104 may be performed under a rest condition, and the as-measured value through steps 102 and 104 may be utilized under a stress condition.

The multiple data sets 100 may also include the acquisition of spectral data 105. That is, another one of the multiple data sets 100 that may be acquired includes control spectral data, indicated at step 106, which may be acquired using a pulse sequence that samples the fully relaxed control spectrum without saturation. A further of the multiple data sets 100 that may be acquired includes ATPγ saturated spectral data, as indicated at step 108, which may be acquired using a pulse sequence that samples the P-31 spectrum while ATPγ magnetization is saturated. Still another one of the multiple data sets 100 that may be acquired includes PCr-Pi saturated spectral data, as indicated at step 110, which may be acquired using a pulse sequence that samples the P-31 spectrum while magnetization from both PCr and Pi is saturated.

Figure 2A:
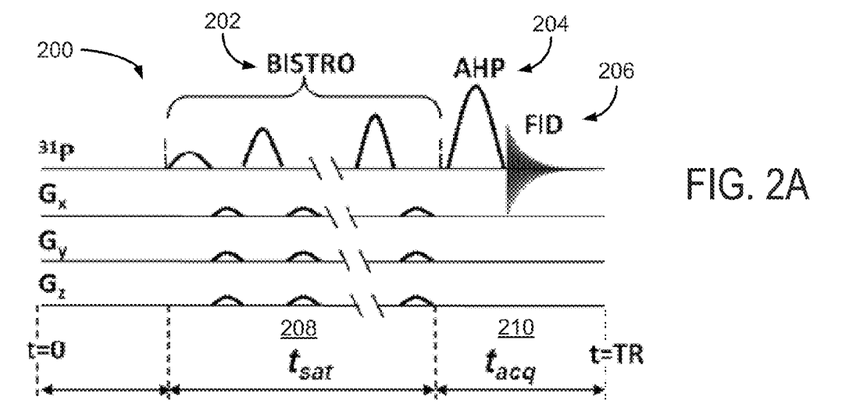
FIG. 2A is a pulse sequence diagram setting froth an example of a pulse sequence that may be used in accordance with the present invention to acquire desired data.

The spectral data 105 may be acquired using adiabatic half passage RF pulses for excitation to minimize flip angle variations due to $B_1$ inhomogeneities caused by the surface coil. By way of example, saturated data may be acquired using a B1-insensitive train to obliterate signal (BISTRO) pulse sequence to enable frequency-selective elimination of magnetization in the presence of $B_1$-inhomogeneity from the surface coil. An example of the BISTRO pulse sequence 200 is illustrated in FIG. 2A and is described by R. A. de Graaf R A, et al., in "B1-insensitive, single-shot localization and water suppression," *J Magn Reson B*, 1996; 113:35-45, and by Q. Xiong, et al., in "Novel strategy for measuring creatine kinase reaction rate in the in vivo heart," *Am J Physiol Heart Circ Physiol*, 2009; 297:H1010-1019. In particular, referring to FIG. 2A, the pulse sequence 200 includes a BISTRO-based magnetization saturation 202 followed by adiabatic half-passage pulses (AHP) 204 and a free induction decay (FID) 206. These portions of the pulse sequence 200 divide the BISTRO pulse sequence 200 into a repetition time (TR) that includes a saturation time ($t_{sat}$) 208 and an acquisition time ($t_{acq}$) 210.

Figure 2B:
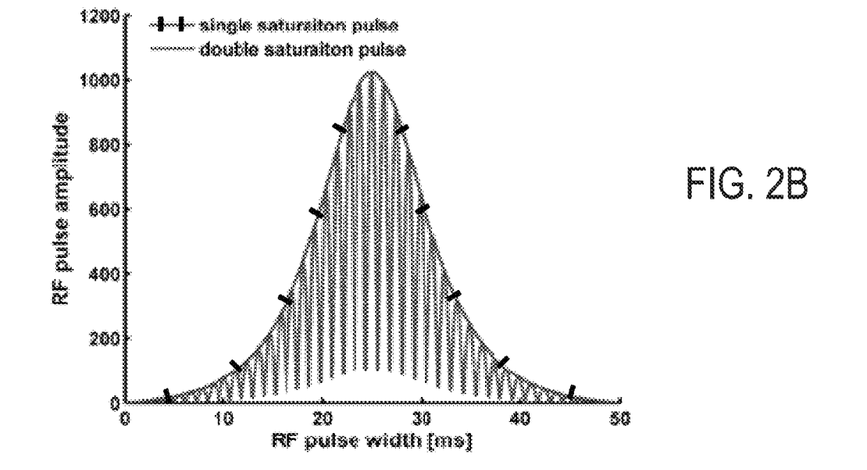
FIGS. 2B-2D are graphs illustrating pulses and pulse sequences for acquisition of magnetization saturation transfer (MST) data.
Figure 2C:
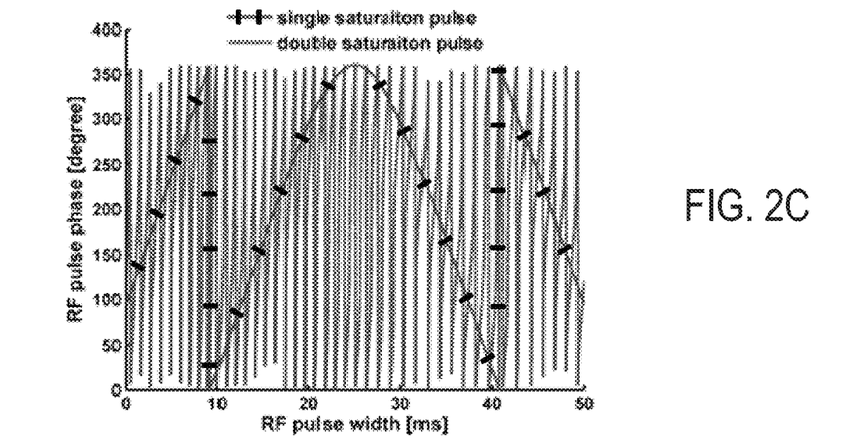
Figure 2D:
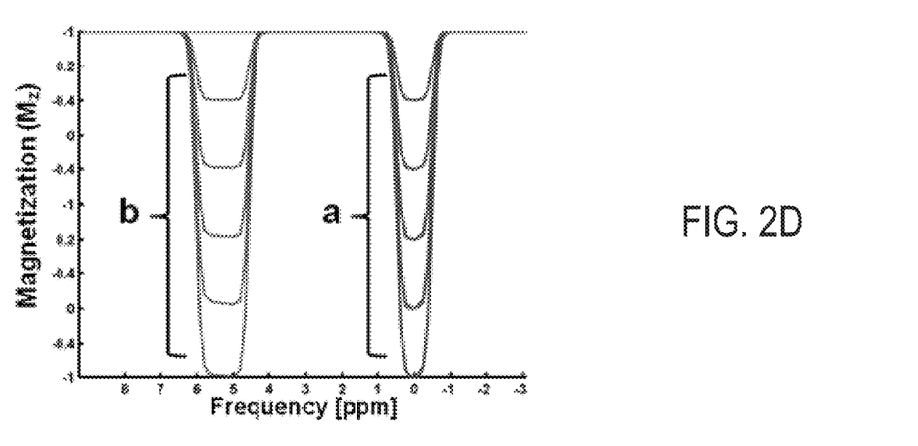

Using a BISTRO pulse sequence 200, spin magnetization can be excited using frequency-selective hyperbolic secant (HS) pulses of varying power levels, examples of which are illustrated in FIGS. 2B and 2C, and can be subsequently eliminated with dephasing gradients. In particular, FIGS. 2B and 2C show the relative amplitude and the phase of the hyperbolic secant-based RF pulses. FIG. 2D shows the response of spin magnetization to RF pulses excitation with various power levels. Double saturation can be achieved by creating a composite pulse from two HS pulses having different excitation frequencies, such as those illustrated in FIGS. 2B and 2C. The magnetization response to such a composite pulse is shown in FIG. 2D, where two excitation bands with distinct frequencies can be readily observed. A larger bandwidth may be used to compensate for any change in the chemical shift of Pi that could result from variations of pH. To this end, the excitation band in FIG. 2B (for Pi saturation) has a wider bandwidth than FIG. 2A in order to compensate the possible change of Pi chemical shift due to change of pH values.

Figure 2E:
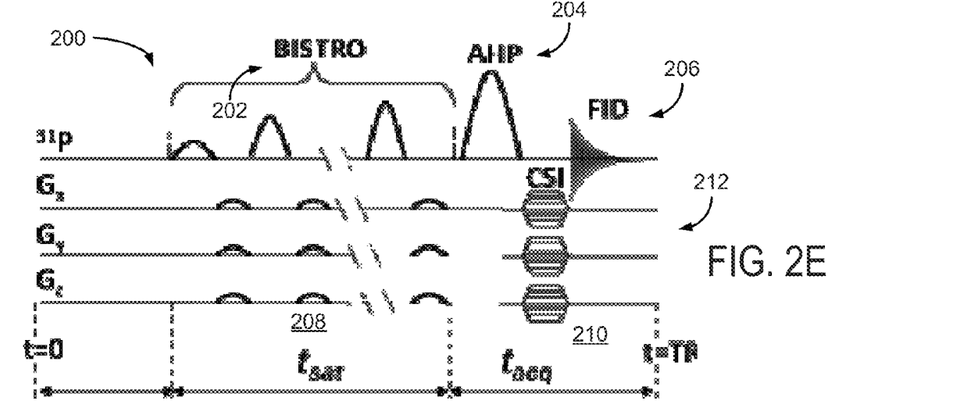
FIG. 2E is a pulse sequence diagram of B1-insensitive train to obliterate signal (BISTRO)-based magnetization saturation in combination with chemical shift imaging (CSI) module for spatial mapping in accordance with the present disclosure.
Figure 2F:
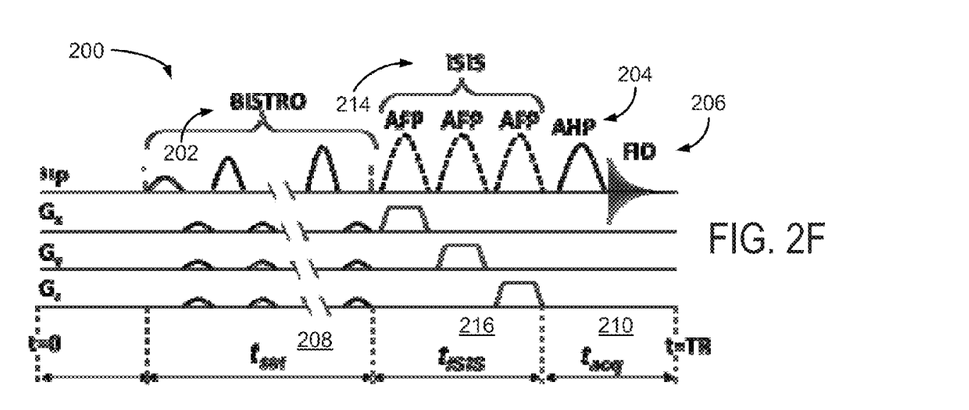
FIG. 2F is a pulse sequence diagram of BISTRO-based magnetization saturation in combination with image selected in vivo spectroscopy (ISIS) module for spatial localization in accordance with the present disclosure.

Other pulse sequences and variations on the above-described pulse sequences may be used with the present invention. For example, the proposed saturation scheme may also be used with imaging or localization capabilities. For example, referring to FIG. 2E, a chemical shift imaging (CSI) 212 module or, referring to FIG. 2F, an image selected in vivo spectroscopy (ISIS) module 214 may be added after the BISTRO saturation 202 to achieve spatial localization. In FIG. 2F, the TR is divided into a third portion or the ISIS module 214, $t_{ISIS}$ 216. Consequently, an ATP hydrolysis rate may be measured in a totally non-invasive fashion.

Referring again to FIG. 1, using the inversion-recovery data acquired at step 101 such as acquired in steps 102 and 104, longitudinal relaxation time constants for ATPγ and PCr can be calculated, respectively, as indicated at steps 112 and 114, respectively. By way of example, apparent longitudinal relaxation time constants can be calculated from exponential fits of the acquired data and intrinsic longitudinal relaxation time constants can then be calculated using Equation 10.

Using the spectral data at step 105 such as acquired in steps 106-110, magnetization values for different metabolites can be calculated. As indicated at step 116, $M_{0,PCr}$, $M_{0,ATP\gamma}$, and $M_{0,Pi}$ can be calculated from the control spectral data; as indicated at step 118, $M_{ss,PCr}$ and $M_{ss,Pi}$ can be calculated from the ATPγ-saturated spectral data; and as indicated at step 120, $M_{ss,ATP\gamma}$ can be calculated from the PCr-Pi saturated spectral data.

The forward rate constants of PCr→ATP ($k_{PCr \to ATP}$) and Pi→ATP ($k_{Pi \to ATP}$) can then be calculated, as indicated at step 122. These rates can be calculated using Equation 8 above and the PCr-Pi inversion-recovery data, control spectral data, and ATPγ-saturated spectral data. The rate constants of $k_{r,tot}$ and $k_{ATP \to Pi}$ can then be calculated, as indicated at step 124. These rates can be calculated using Equations 17 and 18 above and using the ATPγ inversion-recovery data, control spectral data, and PCr-Pi saturated spectral data.

Thus, a $^{31}P$ magnetization saturation transfer (MST) method is provided for measuring ATP hydrolysis rate of a patient without requiring direct quantification of inorganic phosphate. The method includes measuring the intrinsic $T_1$ of PCr and Pi using an inversion recovery experiment with ATPγ saturation, measuring the intrinsic $T_1$ of ATPγ using an inversion recovery experiment with both PCr and Pi saturation, measuring $M_{0,PCr}$, $M_{0,ATP\gamma}$ and $M_{0,Pi}$ using fully relaxed control spectrum without saturation, measuring $M_{ss,PCr}$ and $M_{ss,Pi}$ using spectrum with ATPγ saturated, and measuring $M_{ss,ATP\gamma}$ using spectrum with both PCr and Pi saturation, wherein the forward rate constants of PCr→ATP ($k_{PCr \to ATP}$) and Pi→ATP ($k_{Pi \to ATP}$), and the rate constants of $k_{r,tot}$ and $k_{ATP \to Pi}$ can be determined using rate equations and the acquired data.

As one example of a clinical application of the indirect P-31 MRS-MST method of the present invention, the method may be used to evaluate the treatment of an ischemic myocardial infarction injury. For instance, the method may be used to evaluate the treatment of a patient with induced pluripotent stem cell (iPSC) therapy by monitoring ATP hydrolysis rates in myocardial tissue before and after treatment.

Conventional approaches for measuring ATP→Pi kinetics have not been used successfully for routine in-vivo assessments of cardiac ATP metabolism. One reason is because the conventional techniques require the direct quantification of Pi levels. The relationship between scan time and the signal-to-noise ratio of an MR spectrum is dependent on $T_1/M_0^2$. This means that the total scan time needed to quantify Pi levels in, for example, skeletal muscle would be around three hundred times greater than the time needed to quantify PCr and around fifty times greater than the time needed to quantify ATPγ with the same accuracy that can be achieved with the systems and methods of the present invention. Thus, indirect P-31 MRS-MST assessment of the present invention dramatically reduces the scan time and improves the signal-to-noise ratio by eliminating the need to quantify Pi levels. The total scan time, including the measurement of $T_1$, is on the order of thirty minutes, and if the $T_1$ values are already known (such as when the same heart is re-evaluated under different workload conditions), the scan time needed for the three-spectra MST experiment can be reduced to around eight minutes. These advantages can be highly advantageous for investigations of many organs and physiological systems, because even in tissues where Pi can be quantified, such as the brain and skeletal muscle, it is much less abundant, and has a much longer $T_1$, than PCr or ATP. The present invention also includes a $T_1^{nom}$ method that enables the ATP turnover rate to be accurately quantified under partially relaxed conditions, thereby reducing the scan time of the MST experiment by up to an order of magnitude. The $T_1^{nom}$ technique is readily compatible with our new indirect 31P MRS-MST approach and, consequently, can reduce the scan time even further.

To this end, the present invention has been successfully used in clinical and research settings. For example, as described in "Myocardial repair in a porcine model using fibrin patch enhanced co-transplantation of three cardiovascular cell populations derived from human induced pluripotent stem cells" by Ye et al., which is incorporated herein by reference in its entirety, the present invention was used to determine whether the improvements in myocardial systolic thickening fraction and LV chamber function were accompanied by improvement in efficiency of ATP utilization. In particular, the present invention was used to measure myocardial ATP hydrolysis rate in vivo. Also, in "Bioenergetic and functional consequences of hypertrophied myocardium: an in vivo study of swine model of pressure overload" by Xiong et al. and "Functional consequences of human induced pluripotent stem cell therapy: Myocardial ATP turnover rate in the in vivo swine heart with postinfarction remodeling." Circulation. 2013; 127:997-1008 by Xiong et al., which are both incorporated herein by reference in their entirety, MRI and MRS studied using the above-described systems and method were advantageously conducted.

These are but a few examples. The present invention may be applied to investigate a number of clinical settings. For example, the present invention may be useful in analyzing cancer (such as in the brain, breast, and prostate), heart disease, epilepsy, Alzheimer's Disease, Parkinson's disease, Huntington's Chorea, and pituitary tuberculosis, to name but a few examples.

As noted above, the present invention may be generally applied to any organ system. In one embodiment, the present invention may be applied to some organ systems where inorganic phosphate level is difficult to quantify, thereby making it significantly difficult to obtain accurate and reliable conventional MRS-MST measurements. Examples of organ systems that can be examined using the method of the present invention include in vivo heart, brain, skeletal muscle, liver, and so on.

As noted above, the present invention quantifies two abundant metabolites that are visible in P-31 magnetic resonance spectroscopy: PCr and ATP. Because these metabolites are abundant, the present invention is capable of achieving better signal-to-noise ratio than conventional MRS-MST measurements, which do not quantify these abundant metabolites.

Figure 3:
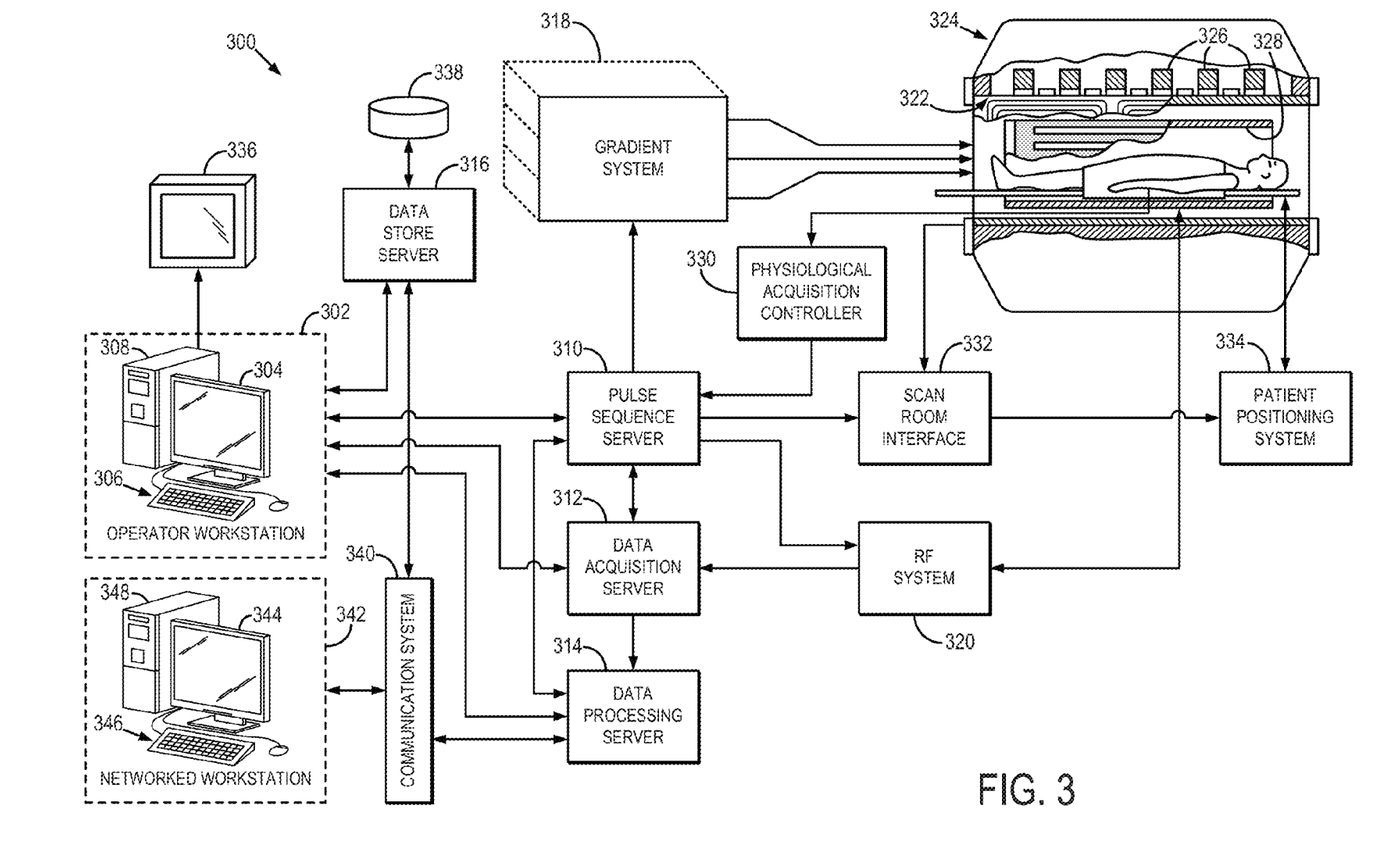
FIG. 3 is a block diagram of an example of a magnetic resonance imaging ("MRI") system that may be configured to operate in accordance with the present invention.

Referring particularly now to FIG. 3, an example of a magnetic resonance imaging ("MRI") system 300 is illustrated that can be used to carry out the above-described processes and perform the above-described pulse sequences. The MRI system 300 includes an operator workstation 302, which will typically include a display 304; one or more input devices 306, such as a keyboard and mouse; and a processor 308. The processor 308 may include a commercially available programmable machine running a commercially available operating system. The operator workstation 302 provides the operator interface that enables scan prescriptions to be entered into the MRI system 300. In general, the operator workstation 302 may be coupled to four servers: a pulse sequence server 310; a data acquisition server 312; a data processing server 314; and a data store server 316. The operator workstation 302 and each server 310, 312, 314, and 316 are connected to communicate with each other. For example, the servers 310, 312, 314, and 316 may be connected via a communication system 340, which may include any suitable network connection, whether wired, wireless, or a combination of both. As an example, the communication system 340 may include both proprietary or dedicated networks, as well as open networks, such as the internet.

The pulse sequence server 310 functions in response to instructions downloaded from the operator workstation 302 to operate a gradient system 318 and a radiofrequency ("RF") system 320. Gradient waveforms necessary to perform the prescribed scan are produced and applied to the gradient system 318, which excites gradient coils in an assembly 322 to produce the magnetic field gradients Gx, Gy, and Gz used for position encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil (not shown in FIG. 3), in order to perform the prescribed magnetic resonance pulse sequence. Responsive magnetic resonance signals detected by the RF coil 328, or a separate local coil (not shown in FIG. 3), are received by the RF system 320, where they are amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the scan prescription and direction from the pulse sequence server 310 to produce RF pulses of the desired frequency, phase, and pulse amplitude waveform. The generated RF pulses may be applied to the whole-body RF coil 328 or to one or more local coils or coil arrays (not shown in FIG. 3).

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2}$$

and the phase of the received magnetic resonance signal may also be determined according to the following relationship:

$$\phi = \tan^{-1}\left(\frac{Q}{I}\right).$$

The pulse sequence server 310 also optionally receives patient data from a physiological acquisition controller 330. By way of example, the physiological acquisition controller 330 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, such that no data is lost by data overrun. In some scans, the data acquisition server 312 does little more than pass the acquired magnetic resonance data to the data processor server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also be employed to process magnetic resonance signals used to detect the arrival of a contrast agent in a magnetic resonance angiography ("MRA") scan. By way of example, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the operator workstation 302. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 314 are conveyed back to the operator workstation 302 where they are stored. Real-time images are stored in a data base memory cache (not shown in FIG. 3), from which they may be output to operator display 312 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the operator workstation 302. The operator workstation 302 may be used by an operator to archive the images, produce films, or send the images via a network to other facilities.

The MRI system 300 may also include one or more networked workstations 342. By way of example, a networked workstation 342 may include a display 344; one or more input devices 346, such as a keyboard and mouse; and a processor 348. The networked workstation 342 may be located within the same facility as the operator workstation 302, or in a different facility, such as a different healthcare institution or clinic.

The networked workstation 342, whether within the same facility or in a different facility as the operator workstation 302, may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may exchanged between the data processing server 314 or the data store server 316 and the networked workstations 342, such that the data or images may be remotely processed by a networked workstation 342. This data may be exchanged in any suitable format, such as in accordance with the transmission control protocol ("TOP"), the internet protocol ("IP"), or other known or suitable protocols.

As used herein, the term "patient" refers to a human or non-human mammalian subject for which an in vivo measurement of ATP hydrolysis rate is desired. The present invention is generally applied to humans; however, in certain embodiments, non-human mammals may also be examined, including for a number of veterinary purpose. For example, one may wish to treat commercially important farm animals, such as cows, horses, pigs, rabbits, goats, and sheep. One may also wish to treat companion animals, such as cats and dogs.

The present invention has been described in terms of one or more preferred embodiments, and it should be appreciated that many equivalents, alternatives, variations, and modifications, aside from those expressly stated, are possible and within the scope of the invention.

We claim:

1. A magnetic resonance imaging (MRI) system comprising:
   a magnet system configured to generate a polarizing magnetic field about at least a region of interest (ROI) in a subject arranged in the MRI system;
   a plurality of gradient coils configured to apply a gradient field to the polarizing magnetic field;
   a radio frequency (RF) system configured to apply an excitation field to the subject and acquire MR image data from a ROI;
   a computer system programmed to:
   control the plurality of gradient coils and the RF system according to a pulse sequence to acquire data including intrinsic longitudinal relaxation time of phosphocreatine (PCr), $T_{1,PCr}^{int}$, acquired using an inversion recovery data acquisition with saturation of a gamma phosphate in adenosine triphosphate (ATPγ);
   control the plurality of gradient coils and the RF system according to a pulse sequence to acquire data including an intrinsic longitudinal relaxation time of ATPγ, $T_{1,ATP\gamma}^{int}$, acquired using an inversion recovery data acquisition with both PCr and inorganic phosphate (Pi) saturation;
   measure equilibrium magnetization of PCr ($M_{0,PCr}$) and equilibrium magnetization of ATPγ ($M_{0,ATP\gamma}$) using a relaxed control phosphorous-31 (P-31) spectrum acquired without saturation;
   measure steady-state magnetization of PCr ($M_{ss,PCr}$) using a P-31 spectrum acquired with ATPγ saturation;
   measure steady-state magnetization of ATPγ ($M_{ss,ATP\gamma}$) using a P-31 spectrum acquired with both PCr and Pi saturation; and
   calculate an ATP hydrolysis rate using the intrinsic longitudinal relaxation times of PCr and ATPγ, the equilibrium magnetization of PCr and ATPγ, and the steady-state magnetization of PCr and ATPγ.

2. A method for calculating adenosine triphosphate (ATP) hydrolysis rate, the method comprising the steps of:
   a) acquiring data including intrinsic longitudinal relaxation time of phosphocreatine (PCr), $T_{1,PCr}^{int}$, acquired using an MRI system to perform an inversion recovery data acquisition with saturation of a gamma phosphate in adenosine triphosphate (ATPγ);
   b) acquiring data including an intrinsic longitudinal relaxation time, $T_{1,ATP\gamma}^{int}$, of ATPγ acquired using the MRI system to perform an inversion recovery data acquisition with both PCr and inorganic phosphate (Pi) saturation;
   c) measuring equilibrium magnetization of PCr ($M_{0,PCr}$) and equilibrium magnetization of ATPγ ($M_{0,ATP\gamma}$) using a relaxed control phosphorous-31 (P-31) spectrum acquired without saturation using the MRI system;
   d) measuring steady-state magnetization of PCr ($M_{ss,PCr}$) using a P-31 spectrum acquired with ATPγ saturation using the MRI system;
   e) measuring steady-state magnetization of ATPγ ($M_{ss,ATP\gamma}$) using a P-31 spectrum acquired with both PCr and Pi saturation using the MRI system;
   calculating with a computer system, an ATP hydrolysis rate using the intrinsic longitudinal relaxation times of PCr and ATPγ, the equilibrium magnetization of PCr and ATPγ, and the steady-state magnetization of PCr and ATPγ; and g) generating with the computer system, a report indicating at least the ATP hydrolysis rate determined in step f).

3. The method as recited in claim 2 in which step f) includes calculating a forward rate constant of a PCr→ATP reaction and a total rate constant of combined PCr→ATP and Pi→ATP reactions.

4. The method as recited in claim 3 in which the forward rate constant of the PCr→ATP reaction is calculated using a rate equation having the following form:

$$k_{PCr \to ATP} = \frac{1}{T_{1,PCr}^{int}} \cdot \frac{M_{0,PCr} - M_{ss,PCr}}{M_{ss,PCr}}.$$

5. The method as recited in claim 3 in which the total rate constant is calculated using a rate equation having the following form:

$$k_{ATP,tot} = \frac{1}{T_{1,ATP\gamma}^{int}} \cdot \frac{M_{0,ATP\gamma} - M_{ss,ATP\gamma}}{M_{ss,ATP\gamma}}.$$

6. The method as recited in claim 3 in which step f) includes calculating the ATP hydrolysis rate by subtracting the forward rate constant of the PCr→ATP reaction from the total rate constant.

7. The method as recited in claim 6 in which the ATP hydrolysis rate is calculated according to:

$$k_{ATP \to Pi} = k_{ATP,tot} - \frac{M_{0,PCr}}{M_{0,ATP\gamma}} k_{PCr \to ATP}.$$

8. The method as recited in claim 2 in which the ATP hydrolysis rate calculated in step f) is the ATP hydrolysis rate of at least one of in vivo heart tissue and skeletal muscle tissue.

9. A magnetic resonance imaging (MRI) system comprising:
   a magnet system configured to generate a polarizing magnetic field about at least a region of interest (ROI) in a subject arranged in the MRI system;
   a plurality of gradient coils configured to apply a gradient field to the polarizing magnetic field;
   a radio frequency (RF) system configured to apply an excitation field to the subject and acquire MR image data from a ROI;
   a computer system programmed to:
      control the plurality of gradient coils and the RF system according to an inversion recovery pulse sequence in order to acquire inversion-recovery data from the subject;
      control the plurality of gradient coils and the RF system according to a pulse sequence in order to acquire spectral data of a phosphate-31 spectrum from the subject;
      using the inversion-recovery data and the spectral data, determine adenosine triphosphate (ATP) hydrolysis rate of the subject without a quantification of inorganic phosphate.

10. The MRI system as recited in claim 9 in which acquiring the inversion-recovery data includes intrinsic longitudinal relaxation times of phosphocreatine (PCr) acquired with saturation of a gamma phosphate in adenosine triphosphate (ATPγ) and intrinsic longitudinal relaxation time of ATPγ acquired with both PCr and inorganic phosphate (Pi) saturation.

11. The MRI system as recited in claim 10 in which the processor is further programmed to measure of equilibrium magnetization of PCr, ATPγ, and Pi using a relaxed control phosphorous-31 (P-31) spectrum acquired without saturation.

12. The MRI system as recited in claim 11 in which the processor is further programmed to measure steady-state magnetization of PCr and Pi using a P-31 spectrum acquired with ATPγ saturation.

13. The MRI system as recited in claim 12 in which the processor is further programmed to measure steady-state magnetization of ATPγ using a P-31 spectrum acquired with both PCr and Pi saturation.

14. The MRI system of as recited in claim 13 in which the processor is further programmed to calculate an ATP hydrolysis rate using the intrinsic longitudinal relaxation times of PCr and ATPγ, the equilibrium magnetization of PCr and ATPγ, and the steady-state magnetization of PCr and ATPγ.

15. The MRI system as recited in claim 9 in which the processor is further programmed to calculate a forward rate constant of a PCr→ATP reaction and a total rate constant of combined PCr→ATP and Pi→ATP reactions to determine the ATP hydrolysis rate.

16. The MRI system of as recited in claim 15 in which the processor is further programmed to calculate the ATP hydrolysis rate by subtracting the forward rate constant of the PCr→ATP reaction from the total rate constant.

17. The MRI system of as recited in claim 15 in which the processor is further programmed to calculate the ATP hydrolysis rate according to:

$$k_{ATP \to Pi} = k_{ATP,tot} - \frac{M_{0,PCr}}{M_{0,ATP\gamma}} k_{PCr \to ATP}.$$

18. The MRI system as recited in claim 9 in which the pulse sequence includes a B1-insensitive train to obliterate signal (BISTRO) pulse sequence.

19. The MRI system as recited in claim 9 in which the pulse sequence includes at least one of a chemical shift imaging (CSI) module and an image selected in vivo spectroscopy (ISIS) module.

* * * * *

UNITED STATES PATENT AND TRADEMARK OFFICE
CERTIFICATE OF CORRECTION

PATENT NO. : 9,709,649 B2  
APPLICATION NO. : 14/175518  
DATED : July 18, 2017  
INVENTOR(S) : Qiang Xionh et al.

Page 1 of 1

It is certified that error appears in the above-identified patent and that said Letters Patent is hereby corrected as shown below:

In the Specification

Column 11, Line 56, "("TOP")" should be --("TCP")--.

In the Claims

Column 14, Line 3, Claim 9, "phosphate" should be --phosphorous--.

Signed and Sealed this
Second Day of January, 2018

Joseph Matal
*Performing the Functions and Duties of the*
*Under Secretary of Commerce for Intellectual Property and*
*Director of the United States Patent and Trademark Office*